United States Patent
Uzawa

(10) Patent No.: US 6,614,503 B1
(45) Date of Patent: Sep. 2, 2003

(54) PROJECTION EXPOSURE APPARATUS, AND DEVICE MANUFACTURING METHOD WHICH COMPENSATE FOR A CHANGE IN OPTICAL PERFORMANCE OF A PROJECTION OPTICAL SYSTEM

(75) Inventor: Shigeyuki Uzawa, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/658,464

(22) Filed: Sep. 8, 2000

(30) Foreign Application Priority Data

Sep. 9, 1999 (JP) .......................... 11-255552

(51) Int. Cl.$^7$ ................ G03B 27/52; G03B 27/42; G03B 27/68; G03C 5/00
(52) U.S. Cl. ............... 355/30; 355/53; 355/52; 355/55; 430/30
(58) Field of Search ............... 355/30, 52, 55, 355/53, 71; 430/30; 353/122

(56) References Cited

U.S. PATENT DOCUMENTS

| 4,714,331 A | * 12/1987 | Oda et al. ................. 353/122 |
| 5,270,771 A | * 12/1993 | Sato ............................. 355/53 |
| 6,235,438 B1 | * 5/2001 | Suzuki et al. ................ 430/30 |

* cited by examiner

*Primary Examiner*—Russell Adams
*Assistant Examiner*—Peter B Kim
(74) *Attorney, Agent, or Firm*—Fitzpatrick, Cella, Harper & Scinto

(57) ABSTRACT

A projection exposure apparatus includes a projection optical system with a barrel, a pressure measuring device disposed inside and/or outside the barrel, and a device for estimating a change in pressure in accordance with an output of the pressure measuring device and for compensating for a change in optical performance of the projection optical system due to the change in pressure, in accordance with the estimation.

21 Claims, 10 Drawing Sheets

PROJECTION EXPOSURE APPARATUS, AND DEVICE MANUFACTURING METHOD WHICH COMPENSATE FOR A CHANGE IN OPTICAL PERFORMANCE OF A PROJECTION OPTICAL SYSTEM

FIELD OF THE INVENTION AND RELATED ART

This invention relates to a projection exposure apparatus and a device manufacturing method. More particularly, the invention concerns development of an exposure apparatus, an exposure method and a device manufacturing method by which any adverse effect of a change in atmospheric pressure of a projection optical system on the optical performance of the projection optical system can be compensated for.

Conventional exposure apparatuses have paid little attention to a sudden change in atmospheric pressure inside the apparatus. This is mainly because the atmospheric pressure in the natural environment changes gradually. Even if a low atmospheric pressure passes, the pressure change is about a few hectopascals (hpa).

However, the cleanliness as required becomes more strict and the level of a positive pressure inside a clean room becomes higher. Thus, there may be cases wherein a sudden large pressure change occurs in response to the opening/closing of a door, for example. Now, a clean room of an inside volume of 200 m$^3$ being pressurized to 1020 hpa and a clean room pre-chamber of an inside volume of 5 m$^3$ with a pressure of 1000 hpa are considered. If, in this case, the door between the clean room and the pre-chamber is opened, there will occur a change of 0.5 hpa in about 1 second. The amount of change of 0.5 hpa is not small and it cannot be disregarded, in current exposure apparatuses.

Generally, a projection optical system of an exposure apparatus is placed inside a semi-closed system wherein a constant pressure gas flows at a constant speed. In this case, since the projection optical system is open to the atmosphere, the inside pressure changes in response to the atmospheric pressure, with a time lag. The time lag is determined in accordance with the shape of the flow passage, namely, the opening areas of an inlet port and an outlet port as well as the inside resistance.

There may be a case wherein a portion of a projection optical system is disposed in a closed system and wherein the inside gas pressure of the closed system is controlled. In this case, there may not be an adverse effect if the gas pressure control is made with respect to an absolute pressure. If, however, it is made with respect to a differential pressure with the outside pressure, there may be an adverse effect with a lag of the control time constant. The inside pressure of a portion outside the closed space is, of course, variable with a change in the outside atmospheric pressure.

Such a change in pressure inside a projection optical system will cause a change of a refractive index of a gas along the optical path, and thus, an adverse influence to the optical performance thereof. Particularly, the focus and the magnification are most influenced thereby. It is, therefore, desirable to remove these adverse influences.

SUMMARY OF THE INVENTION

It is accordingly an object of the present invention to provide an exposure apparatus, an exposure method and/or a device manufacturing method by which an adverse effect of a change in pressure inside a projection optical system can be compensated for.

In accordance with an aspect of the present invention, there is provided a projection exposure apparatus, comprising: a projection optical system with a barrel; a pressure measuring device disposed in a non-closed space inside the barrel; and means for compensating for a change in optical performance of said projection optical system due to a change in pressure, in accordance with an output of said pressure measuring device.

In accordance with another aspect of the present invention, there is provided a projection exposure apparatus, comprising: a projection optical system with a barrel; a pressure measuring device disposed outside the barrel; and means for estimating an inside pressure of the barrel in accordance with an output of said pressure measuring device and for compensating for a change in optical performance of said projection optical system due to a change in pressure, in accordance with the estimation.

In accordance with a further aspect of the present invention, there is provided a projection exposure apparatus, comprising: a projection optical system with a barrel; a pressure measuring device disposed inside and/or outside the barrel; and means for estimating a change in pressure in accordance with an output of said pressure measuring device and for compensating for a change in optical performance of said projection optical system due to the change in pressure, in accordance with the estimation.

In accordance with a yet further aspect of the present invention, there is provided a projection exposure apparatus, comprising: a projection optical system with a barrel; a pressure measuring device disposed inside and/or outside the barrel; and means for estimating a pressure to be defined after an elapse of a predetermined time, in accordance with an output of said pressure measuring device, and for compensating for a change in optical performance of said projection optical system due to a change in pressure, in accordance with the estimation.

In these aspects of the present invention, the apparatus may further comprise means for flowing a clean gas inside the barrel during an operation of said projection exposure apparatus.

The clean gas may consist of an inert gas such as nitrogen or helium.

The clean gas may consist of air.

The optical performance may be at least one of a focus position, an image plane position, a projection magnification, a distortion, a spherical aberration, a coma aberration, and an image field curvature aberration.

The pressure measuring device may comprise a laser interferometer.

In accordance with a yet further aspect of the present invention, there is provided a device manufacturing method, comprising the steps of: exposing a photosensitive material with a device pattern, by use of an exposure apparatus as recited above; and developing the exposed photosensitive substrate.

In accordance with the present invention, any adverse influence of a change in pressure inside a projection optical system to the optical performance thereof can be compensated for. For example, a change in focus position or magnification due to a pressure change can be corrected.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1:
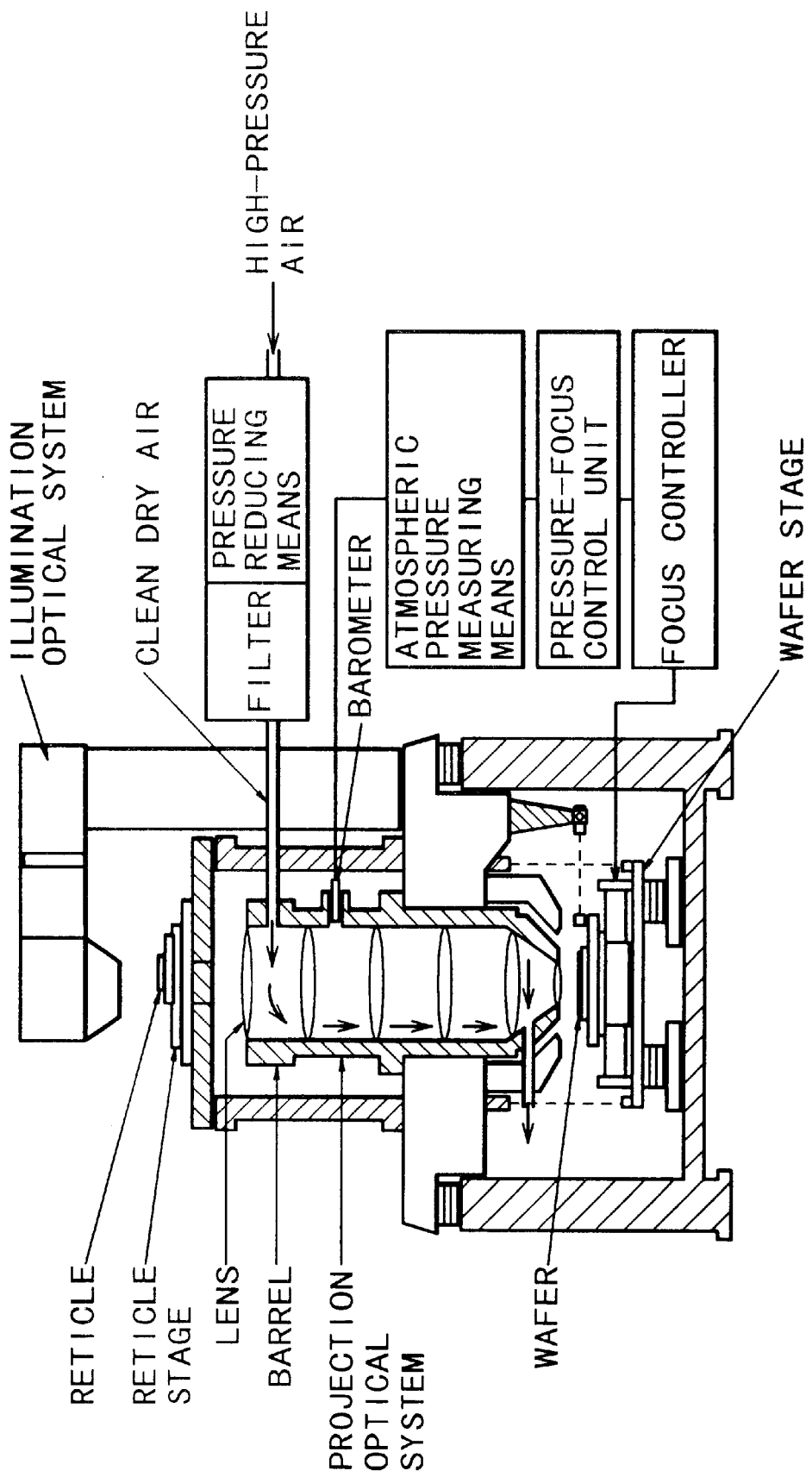
FIG. 1 is a schematic view of an exposure apparatus having a function of focus correction against a change in inside pressure of a barrel.

FIG. 1 shows a first embodiment of the present invention. A barometer is provided in the structure (or barrel) of a projection optical system. The output of the barometer is monitored continuously, and the output signal is supplied to a pressure-focus control unit. The pressure-focus control unit serves to filter the output signal such as by a moving average, for example, with an appropriate width suitable for noise removal. Then, the control unit supplies a focus value (focus position) of the projection optical system to a focus control unit. The focus control unit serves to combine a focus measured value (surface level) of a wafer surface, a focus shift value (the amount of focus position change) due to the exposure process, and a focus shift value (the amount of focus position change) due to the pressure, to practically control the position of a wafer stage with respect to an optical axis direction. In order that this control is made even during the exposure process, the response of the barometer should desirably be sufficiently quick. To this end, a barometer using a laser interferometer, such as a wavelength tracker (WLT), may preferably be used. The WLT type barometer is very sensitive to the temperature and also the pressure. If a He-Ne laser is used, for example, it can show a change of about 1 ppm responsive to an air temperature of 1° C. and a change of 0.27 ppm responsive to a pressure of 1 hpa. On the other hand, inside the structure of the projection optical system, usually a temperature stability of 0.01° C. or less is maintained. Therefore, the output value indicates a pressure change very precisely.

[Embodiment 2]

In the first embodiment, the pressure inside the barrel of the projection optical system is measured directly. Therefore, the measurement precision is very good. However, in order that the correcting drive is made on the basis of a measured value, the driving system must have high responsiveness. Generally, a good-response driving system is expensive, and it has a relatively large design difficulty. A second embodiment has been made in consideration of these inconveniences.

Figure 2:
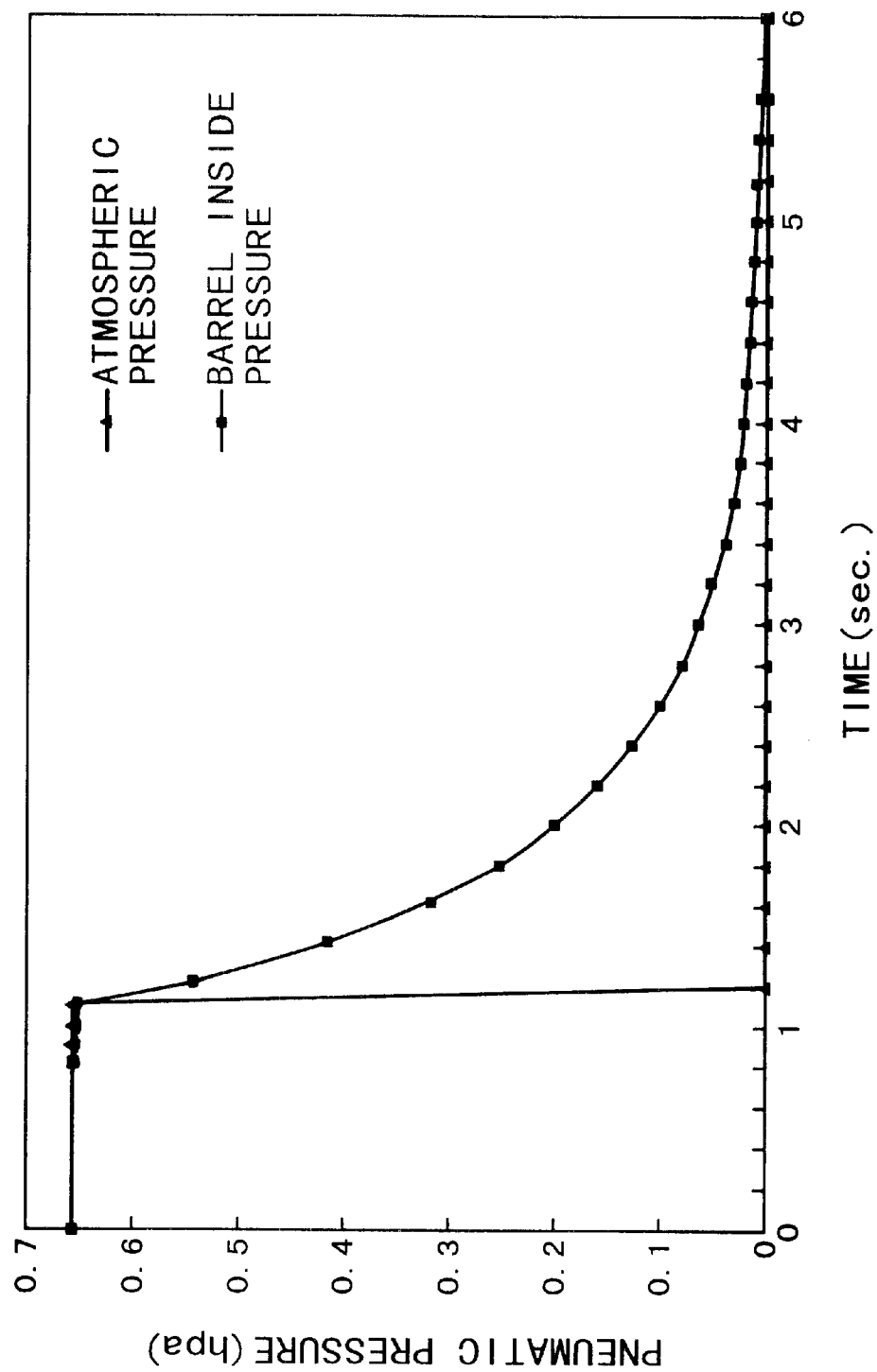
FIG. 2 is a graph for explaining a step response of a pneumatic pressure inside a barrel.
Figure 4:
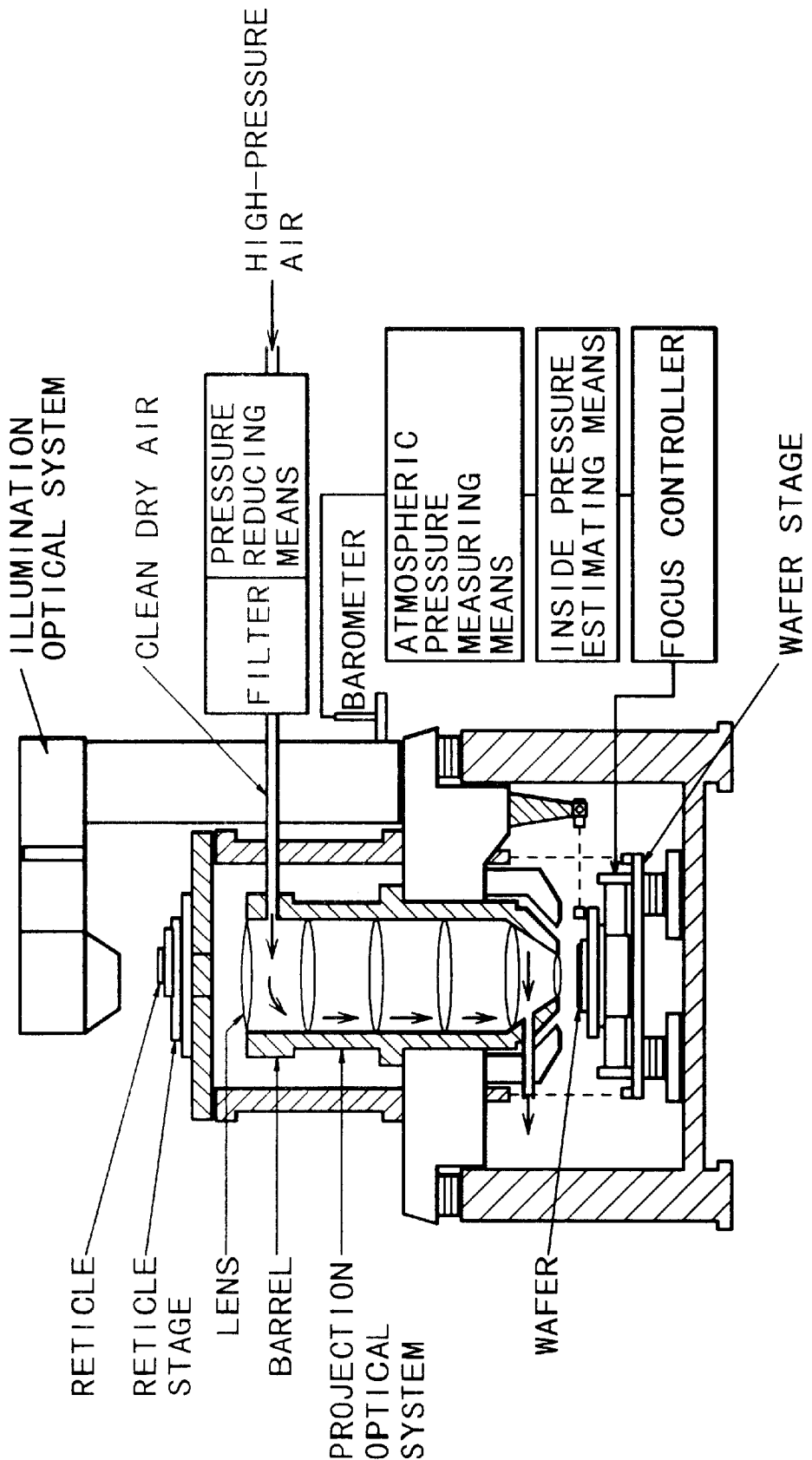
FIG. 4 is a schematic view of an exposure apparatus having a pressure-focus correcting mechanism, based on estimation.

In this embodiment, as shown in FIG. 4, a barometer is provided outside a barrel of a projection optical system. In a case in which the projection optical system has a semi-closed structure, a change in pressure inside a chamber is propagated into the projection optical system, with a short delay and in a slightly loosened shape. In this case, the propagation can be approximated by using a first-order delay control formula. The approximation parameter can be determined on the basis of practical experiments. FIG. 2 is a graph of the pressure inside the barrel, measured by experiments, when the outside pressure is changed stepwise. It is seen that, in regard to the pressure transmission, the barrel comprises a time delay system.

The graph of FIG. 2 can be expressed by an equation such as equation (1) below:

$$Rx(t) = -41 \cdot \log t + 26 \qquad \ldots (1)$$

Figure 3:
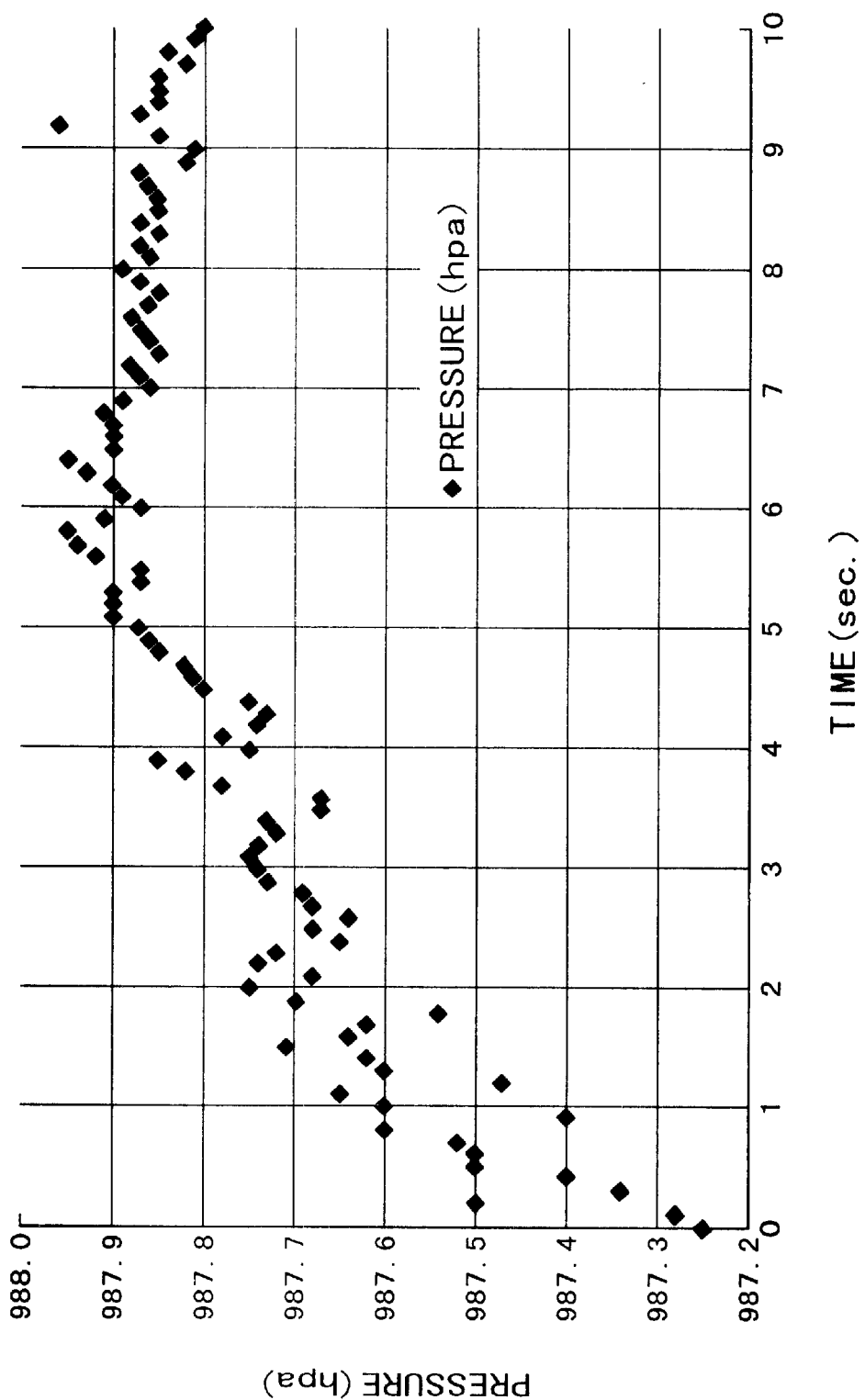
FIG. 3 is a graph for explaining an example of a pressure change in a clean room.

In equation (1), Rx(t) is the pressure inside the barrel in which, at a time moment 1.0, the outside pressure is reduced by 0.6 pascal. On the other hand, as regards the actual pressure change, as shown in FIG. 3, it changes smoothly as compared with the step response. Thus, the pressure inside the barrel can be detected by integrating outside pressure values at respective moments from the impulse response as determined by equation (1).

Namely, if the outside atmospheric pressure is A(t), generally the barrel inside pressure is given by equation (2), below:

$$P(t) = \Sigma \{A(t) \cdot H(t-\tau)\} \qquad \ldots (2)$$

Here, H(t) represents an impulse response function which can be determined as an approximation by experimental formula (1) above. Alternatively, in place of such estimation means using an experimental formula, the relationship between the inside pressure and the outside pressure may be detected beforehand on the basis of experiments, and the relationship data may be stored as a table. The estimation may be done on the basis of the thus prepared table, with substantially the same advantageous result.

In FIG. 4, an inside pressure estimating means serves to apply a filter to the data from a barometer disposed outside the barrel of the projection optical system, by a moving average, for example, with a width suitable for noise removal. Then, the estimating means performs the above-described calculation to estimate the inside pressure of the projection system at respective time moments. A focus control unit then calculates the amount of focus change on the basis of the estimated inside pressure. A wafer stage control unit moves a wafer stage in an optical axis direction of the projection optical system in accordance with the thus calculated focus shift amount. In this manner, regardless of changes in pressure, shot regions on the wafer can be positioned accurately at the best focus position. Thus, in accordance with this embodiment, the pressure outside the barrel is measured and, based on it, the inside pressure of the barrel of the projection optical system is estimated or predicted. Since the actual inside pressure of the projection optical system changes with a delay from the outside pressure, in this embodiment, the change in inside pressure can be predetected before it occurs. Therefore, a driving time for correction of the pressure change can be held.

[Embodiment 3]

A third embodiment is arranged so that, when the value obtained by differentiation, with respect to time, of the output of the barometer disposed inside or outside the projection system becomes greater than a predetermined value, the exposure operation subsequent to it is temporarily interrupted.

In a case in which a barometer is provided outside the barrel but there is no focus correcting means provided for the projection optical system, the pressure inside the projection optical system may be estimated by using predicting means such as used in the second embodiment. When the inside pressure becomes greater than a predetermined value (threshold value) adversely influential to the focus or aberration, the exposure operation may be interrupted. The exposure operation may be re-started after the inside pressure becomes lower than the threshold value. Further, if there is no predicting means, the following method may conveniently be adopted.

Namely, when the value obtained by differentiation, with respect to time, of the output of the barometer, disposed inside or outside the barrel, becomes greater than a predetermined value, the exposure operation subsequent to it is temporarily interrupted. When the differentiation value becomes not greater than the predetermined value, the operation is re-started after a certain delay. The delay time may be calculated in accordance with a delay time of the change in pressure inside the projection optical system, in response to a change in outside atmospheric pressure.

[Embodiment 4]

Figure 5:
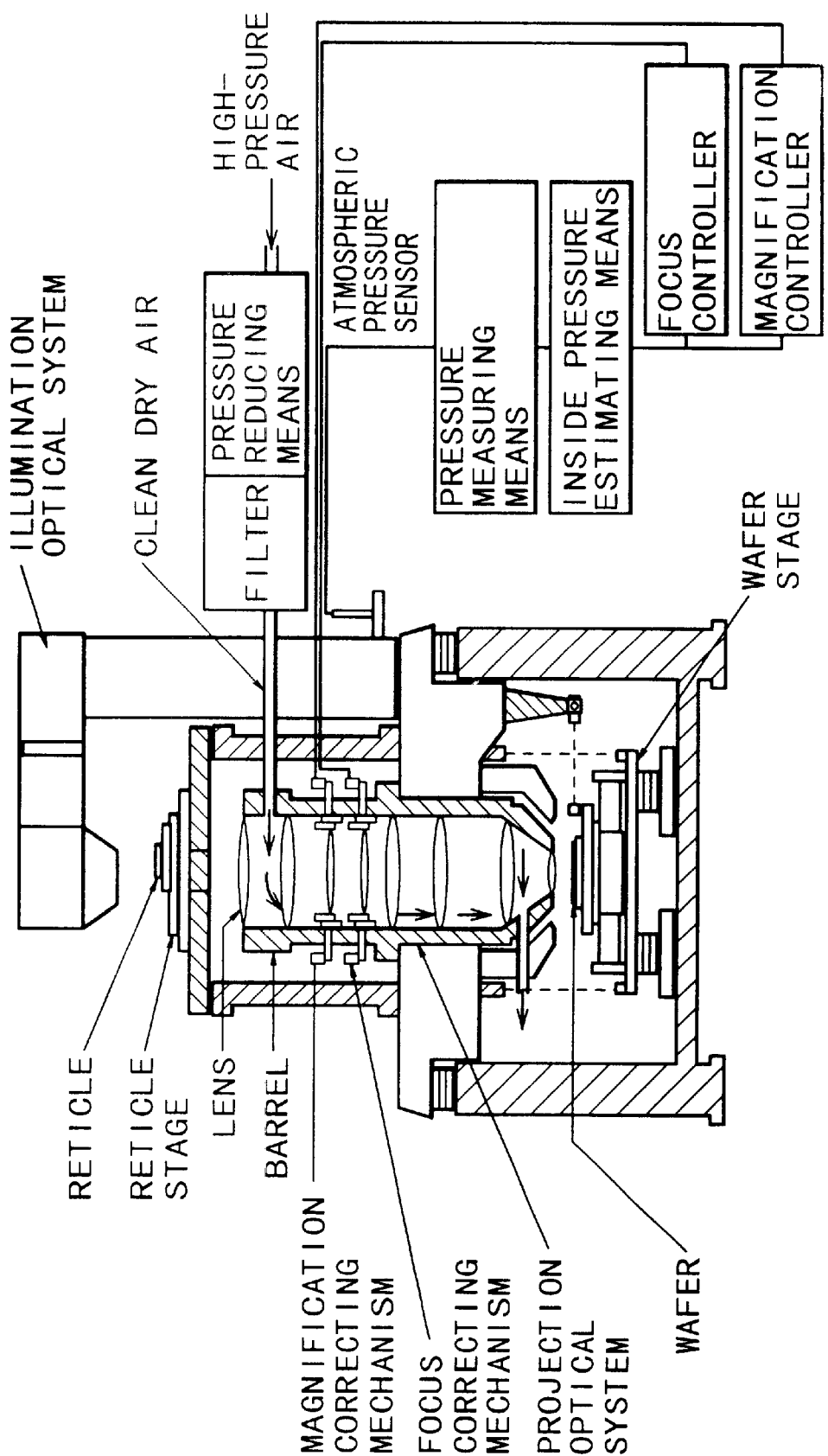
FIG. 5 is a schematic view of an exposure apparatus having a focus and magnification correction mechanism.

FIG. 5 shows a fourth embodiment of the present invention. By moving one or more lenses of the projection optical system along an optical axis direction, the focus position (focus) or projection magnification of the projection optical system can be adjusted. FIG. 5 shows an example having such an adjusting mechanism.

An inside pressure estimating means serves to estimate the inside pressure of the projection optical system at respective time moments, on the basis of a change in atmospheric pressure as measured by an atmospheric pressure sensor. The prediction may be based on the method described with reference to FIG. 2. The inside pressure level as estimated is supplied to a focus control unit and a magnification control unit, whereby a focus correcting lens or lenses and a magnification correcting lens or lenses are driven. Since the estimated pressure level can be obtained as a function of time, before the pressure reaches that level, the focus position and the projection magnification at the moment of an exposure process can be corrected properly.

[Embodiment 5]

Figure 6:
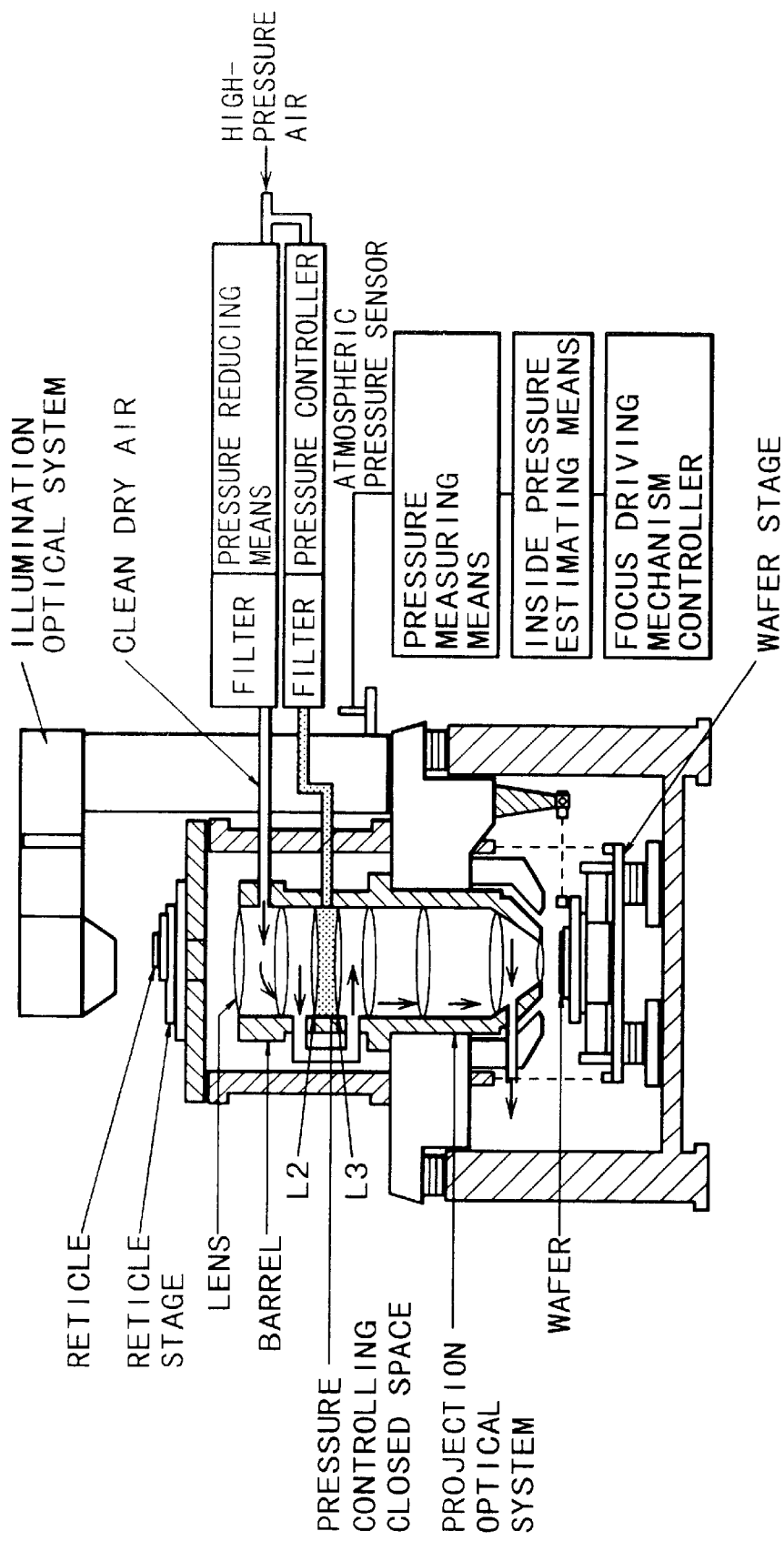
FIG. 6 is a schematic view of an exposure apparatus having a focus correcting mechanism, based on pressure control.

FIG. 6 shows a fifth embodiment of the present invention. This embodiment is an example wherein there is a focus correcting mechanism for controlling the pressure in a predetermined space between lenses inside a projection optical system. Since the projection optical system other than the pressure controlled lenses is influenced by the atmospheric pressure change, in this embodiment, the influence is corrected by using the pressure controlling focus correction mechanism. In FIG. 6, the space between lenses L2 and L3 of the projection optical system is tightly closed. By adjusting the pressure in this space, the focus position of the projection lens can be corrected. The data supplied from an atmospheric pressure sensor outside the barrel may be processed by an inside pressure estimating means, in a similar manner as in the second embodiment and, after it, a signal is supplied to a focus driving mechanism controller. The focus driving mechanism controller detects a pressure value of the closed space corresponding to the estimated focus position, and it supplies the detected value to a pressure controller, whereby the focus position of the projection optical system is corrected.

[Embodiment 6]

Figure 7:
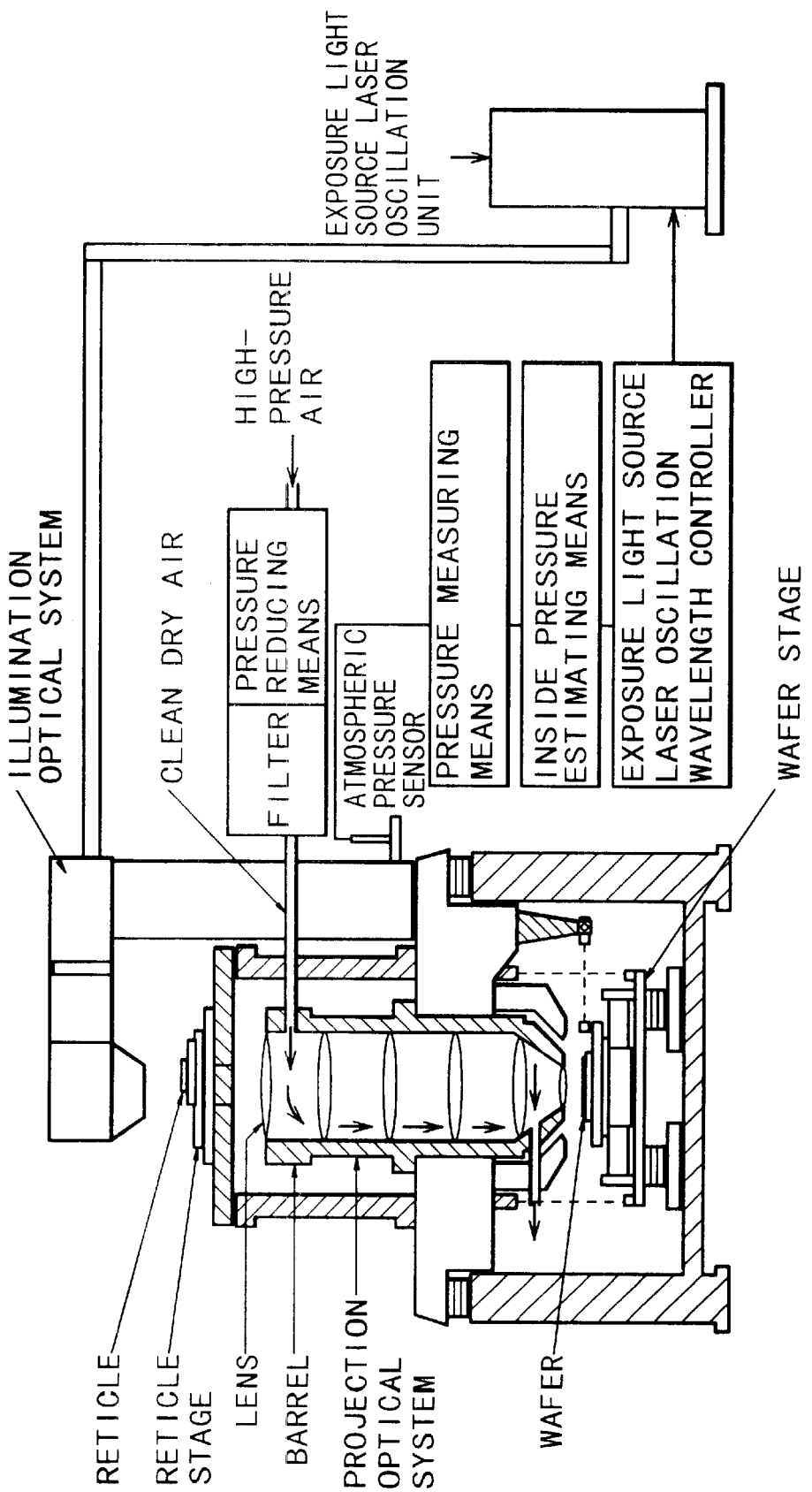
FIG. 7 is a schematic view of an exposure apparatus having a pressure-aberration correcting mechanism, based on exposure wavelength control.

FIG. 7 shows a sixth embodiment of the present invention. An exposure wavelength changing mechanism may be used, by which the optical performance of the projection optical system can be corrected more effectively. Due to a change in atmospheric pressure, the refractive index of a gas along the optical path inside the projection optical system changes. The influence of it can be corrected completely by changing the exposure wavelength. In this case, not only the focus change, but also the magnification as well as aberrations such as chromatic aberration, for example, to be produced by a change in atmospheric pressure can be corrected.

As regards the timing for correction by the wavelength changing mechanism, in a case of a stepper (step-and-repeat projection exposure apparatus) and also in a case of a scanner (step-and-scan projection exposure apparatus), the correction may be done between successive shot exposures or during a shot exposure. In a case of an exposure apparatus using an excimer laser, for example, and when the amount of wavelength change is small, the correction may be done during a shot exposure or between successive shot exposures. If the wavelength is to be changed largely, it may be done in a non-exposure period between shot exposures. This is because there are cases wherein, as a result of changing the wavelength, use of dummy pulses becomes necessary.

Anyway, the pressure change inside the projection optical system is measured directly, or it may be predicted, and then the exposure wavelength is changed to follow the pressure change.

[Embodiment 7]

In a case of a scanning exposure apparatus such as a scanner type described above, in order to meet a pressure change during the scan exposure, the focus position may be corrected by combining the focus position of the projection optical system as measured by a separate means and the shift of the focus position of the projection optical system due to the pressure change. In this case, since the correction has to be made substantially in the same time period as the cycle time of the stage driving, a measuring system such as a WLT, having a high-speed response time, may be used to perform the correction prediction calculation. The predicted value may be directly read out by the stage control system to rewrite the controlled comand position of the stage. The inside pressure estimation method described with reference to the second embodiment may be used, by which the estimated pressure value can be obtained before the pressure reaches that level. Therefore, the focus position at respective exposure time moments can be corrected properly.

[Embodiment 8]

Figure 8:
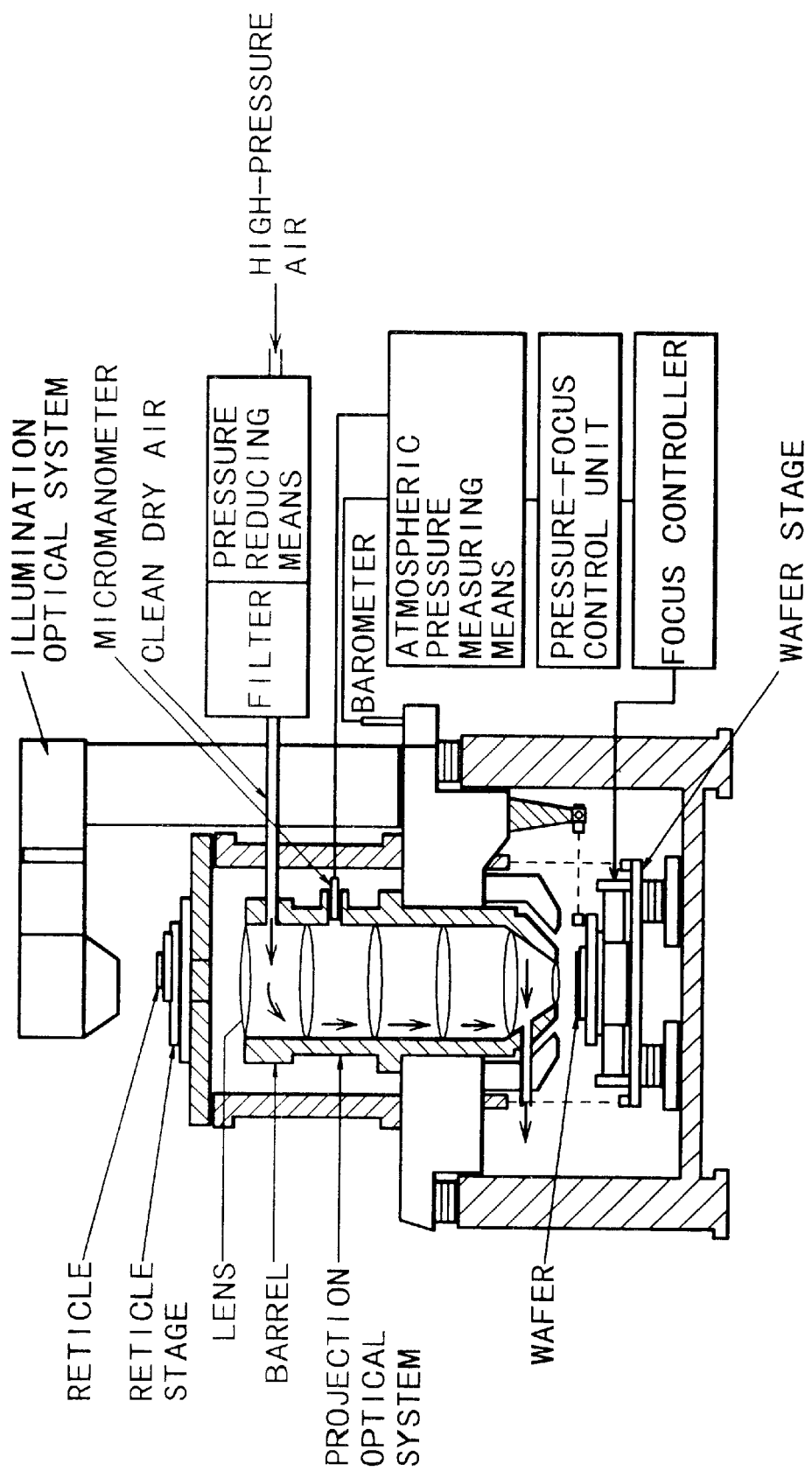
FIG. 8 is a schematic view of another example of an exposure apparatus having a focus correcting function against a change in inside pressure of a barrel.

FIG. 8 shows an eighth embodiment of the present invention. In this embodiment, the inside pressure of the projection optical system is measured by using a micromanometer inside a barrel and a barometer outside the barrel. The remaining portion of this embodiment has substantially the same structure as that of the embodiment of FIG. 1. Since the micromanometer has a high measurement resolving power, higher precision measurement can be accomplished. Further, with the structure of this embodiment, the pressure change inside the projection optical system as estimated by calculation can be measured actually. Therefore, from the measured value, the parameter in an estimation formula used for the estimation can be determined by learning. As a result of it, higher precision estimation can be accomplished.

Each of the exposure apparatuses described above may be disposed in a clean room inside a factory, which room can be accessed by an operator.

Next, an embodiment of a semiconductor device manufacturing method which uses a projection exposure apparatus according to any one of the preceding embodiments will be explained.

Figure 9:
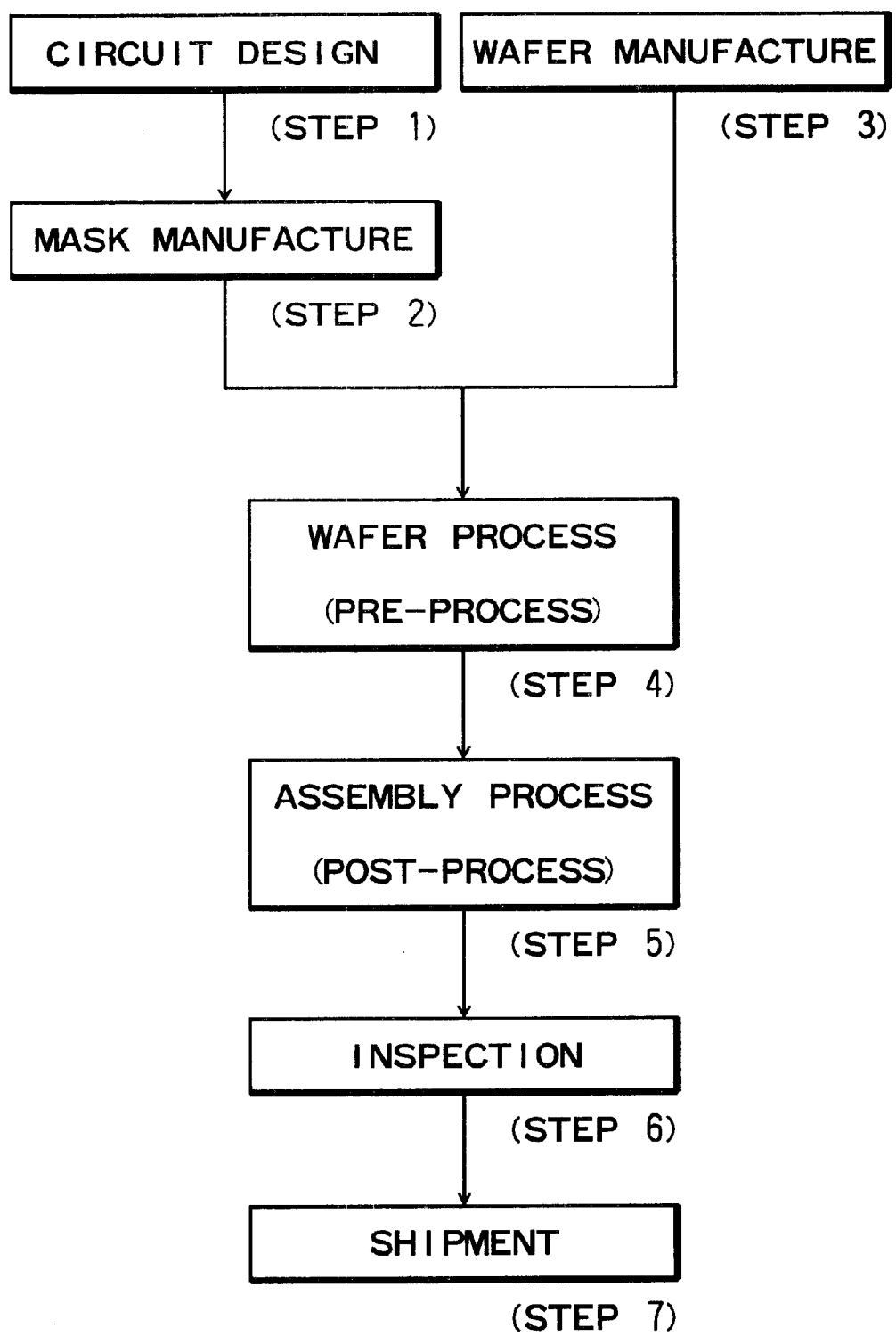
FIG. 9 is a flow chart of device manufacturing processes.

FIG. 9 is a flow chart of a procedure for the manufacture of microdevices such as semiconductor chips (e.g., ICs or LSIs), liquid crystal panels, CCDs thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 10:
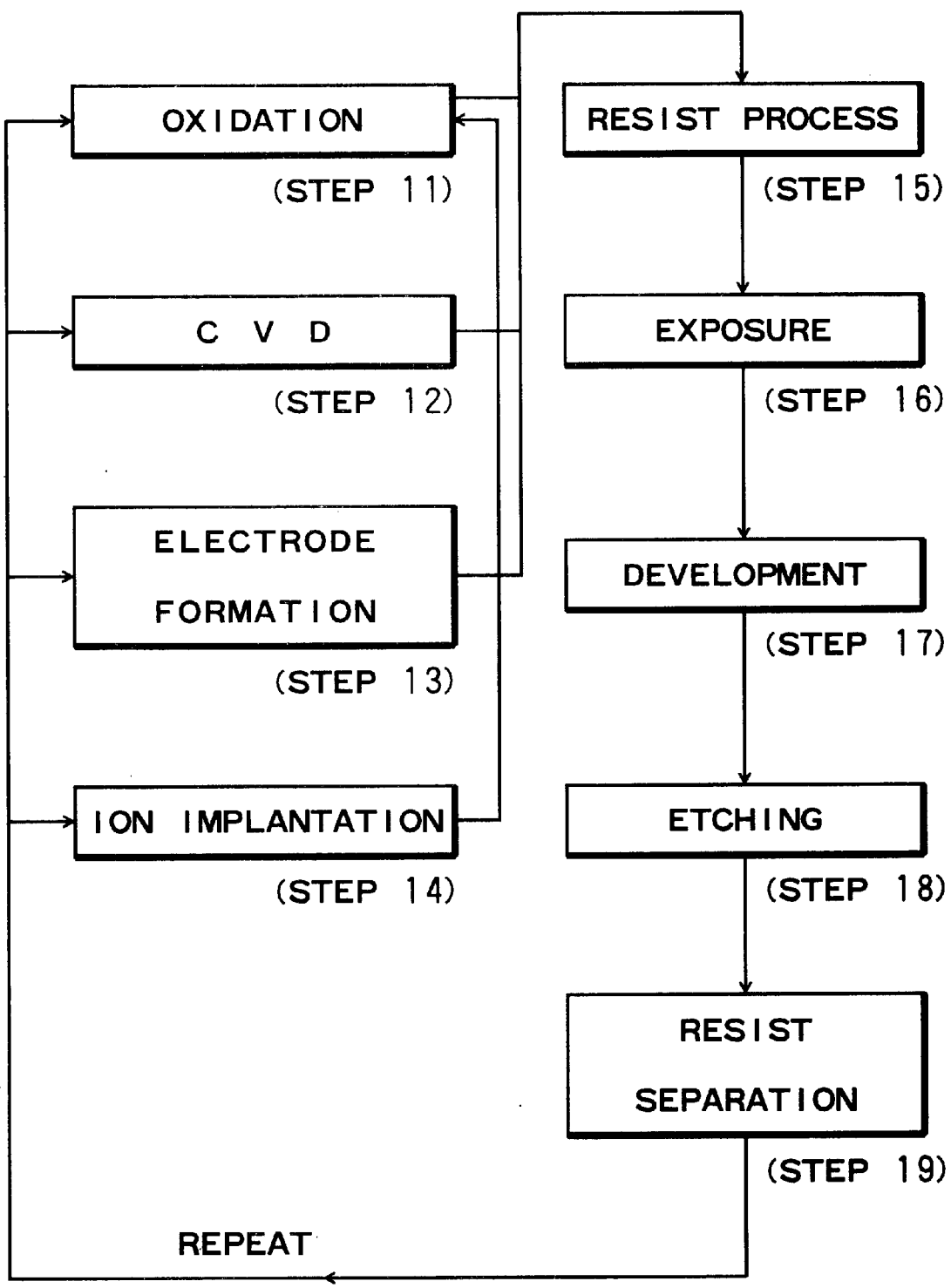
FIG. 10 is a flow chart for explaining details of a wafer process in the procedure of FIG. 9.

FIG. 10 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   a projection optical system with a barrel;
   a pressure measuring device, disposed outside the barrel, for measuring a pressure outside the barrel during an exposure operation; and
   means for estimating an inside pressure of the barrel in accordance with plural outputs of said pressure measuring device, and for compensating for a change in optical performance of said projection optical system due to a change in the inside pressure of the barrel, in accordance with the estimation, wherein the compensation is carried out during the exposure operation.

2. A projection exposure apparatus according to claim 1, further comprising predicting and compensating means for predicting, on the basis of an output of said pressure measuring device, a pressure to be established after an elapse of a predetermined time, and for compensating for a change in optical characteristic of said projection optical system due to the pressure, in accordance with the prediction.

3. An apparatus according to claim 1, further comprising means for causing a clean gas to flow inside the barrel during an operation of said projection exposure apparatus.

4. An apparatus according to claim 3, wherein the clean gas consists of an inert gas.

5. An apparatus according to claim 4, wherein the inert gas is one of nitrogen and helium.

6. An apparatus according to claim 3, wherein the clean gas consists of air.

7. An apparatus according to claim 1, wherein the optical performance is at least one of a focus position, an image plane position, a projection magnification, a distortion, a spherical aberration, a coma aberration, an astigmatism aberration, and an image field curvature aberration.

8. An apparatus according to claim 1, wherein said pressure measuring device comprises a laser interferometer.

9. An apparatus according to claim 1, wherein the compensation is carried out between a shot exposure and a subsequent shot exposure.

10. An apparatus according to claim 1, wherein the compensation is carried out during a shot exposure.

11. A projection exposure apparatus, comprising:
    a projection optical system with a barrel;
    a pressure measuring device, disposed outside the barrel, for measuring a pressure outside the barrel during an exposure operation; and
    means for estimating a change in an inside pressure of the barrel, in accordance with plural outputs of said pressure measuring device, and for compensating for a change in optical performance of said projection optical system due to the change in inside pressure of the barrel, in accordance with the estimation, wherein the compensation is carried out during the exposure operation.

12. A projection exposure apparatus according to claim 11, further comprising predicting and compensating means for predicting, on the basis of an output of said pressure measuring device, a pressure to be established after an elapse of a predetermined time, and for compensating for a change in optical characteristic of said projection optical system due to the pressure, in accordance with the prediction.

13. An apparatus according to claim 11, further comprising means for causing a clean gas to flow inside the barrel during an operation of said projection exposure apparatus.

14. An apparatus according to claim 13, wherein the clean gas consists of an inert gas.

15. An apparatus according to claim 14, wherein the inert gas is one of nitrogen and helium.

16. An apparatus according to claim 13, wherein the clean gas consists of air.

17. An apparatus according to claim 11, wherein the optical performance is at least one of a focus position, an image plane position, a projection magnification, a distortion, a spherical aberration, a coma aberration, an astigmatism aberration, and an image field curvature aberration.

18. An apparatus according to claim 11, wherein said pressure measuring device comprises a laser interferometer.

19. A device manufacturing method, comprising the steps of:

exposing a photosensitive material with a device pattern, by use of an exposure apparatus as recited in any one of claim 1–8 or 11–18; and developing the exposed photosensitive substrate.

20. An apparatus according to claim 11, wherein the compensation is carried out between a shot exposure and a subsequent shot exposure.

21. An apparatus according to claim 11, wherein the compensation is carried out during a shot exposure.

* * * * *

UNITED STATES PATENT AND TRADEMARK OFFICE
CERTIFICATE OF CORRECTION

PATENT NO. : 6,614,503 B1
DATED : September 2, 2003
INVENTOR(S) : Shigeyuki Uzawa It is certified that error appears in the above-identified patent and that said Letters Patent is hereby corrected as shown below:

Title page,
Item [56], References Cited, U.S. PATENT DOCUMENTS, insert the following:

```
-- 4,690,528    9/1987     Tanimoto et al. ......... 353/101
   4,699,505    10/1987    Komoriya et al. ......... 355/30
   4,988,821    3/1991     Ohta et al. ................ 353/122
   5,838,426    11/1998    Shinonaga et al. ........ 355/52 --.
```

Column 5,
Line 27, "time of the" should read -- of the time --.

Column 6,
Line 16, "pressure" should read -- pressure, --.

Signed and Sealed this

Tenth Day of February, 2004

JON W. DUDAS
*Acting Director of the United States Patent and Trademark Office*